(12) United States Patent
Goers et al.

(10) Patent No.: US 6,721,160 B2
(45) Date of Patent: Apr. 13, 2004

(54) SYSTEM FOR DISSIPATING ELECTROSTATIC CHARGES

(75) Inventors: Andreas Goers, Pattensen (DE); Helmut Michel, Hannover (DE); Reiner Bleil, Peine (DE)

(73) Assignee: ABB Patent GmbH, Mannheim (DE)

( * ) Notice: Subject to any disclaimer, the term of this patent is extended or adjusted under 35 U.S.C. 154(b) by 73 days.

(21) Appl. No.: 09/999,859

(22) Filed: Oct. 23, 2001

(65) Prior Publication Data

US 2002/0064016 A1 May 30, 2002

(30) Foreign Application Priority Data

Oct. 24, 2000 (DE) .......................................... 100 52 628

(51) Int. Cl.[7] .............................................. H01G 47/00
(52) U.S. Cl. ...................................... 361/212; 361/220
(58) Field of Search ............................ 361/56, 42, 117, 361/212, 220

(56) References Cited

U.S. PATENT DOCUMENTS 5,432,916 A * 7/1995 Hahn et al. .................. 710/302

FOREIGN PATENT DOCUMENTS

EP            0558770 A1 *   9/1993

* cited by examiner

Primary Examiner—Anthony Dinkins
(74) Attorney, Agent, or Firm—Michael M. Rickin

(57) ABSTRACT

The invention relates to a system for dissipating electrostatic charges (3) of a pluggable electrical unit (2) with an at least partially electrically conductive housing (20) when it is brought into connection with an at least partially electrically conductive enclosure (10) connected to earth potential of an electrical base unit (1) using a pair of leading contacts (131, 231). In this case, the enclosure (10) is connected to earth potential (4) of the base unit (1) via a first attenuator (111/121), to the frame potential (14) of the base unit (1) via a second attenuator (112/122) and to a first contact device (131). The frame potential (14) of the base unit (1) is connected to a second contact device (132). The housing (20) of the pluggable electrical unit (2) is connected to the frame potential (24) of the pluggable electrical unit (2) via a third attenuator (211/221) and to a first mating contact device (231) via a fourth attenuator (212). The frame potential (24) of the pluggable electrical unit (2) is connected to a second mating contact device (232). The first contact device (131) of the base unit (1) can be connected to the first mating contact device (231) of the pluggable electrical unit (2) and the second contact device (132) of the base unit (1) can be connected to the second mating contact device (232) of the pluggable electrical unit (2), the pair of leading contacts being formed by the first contact device (131) and the first mating contact device (231).

9 Claims, 3 Drawing Sheets

SYSTEM FOR DISSIPATING ELECTROSTATIC CHARGES

DESCRIPTION

Figure 1:
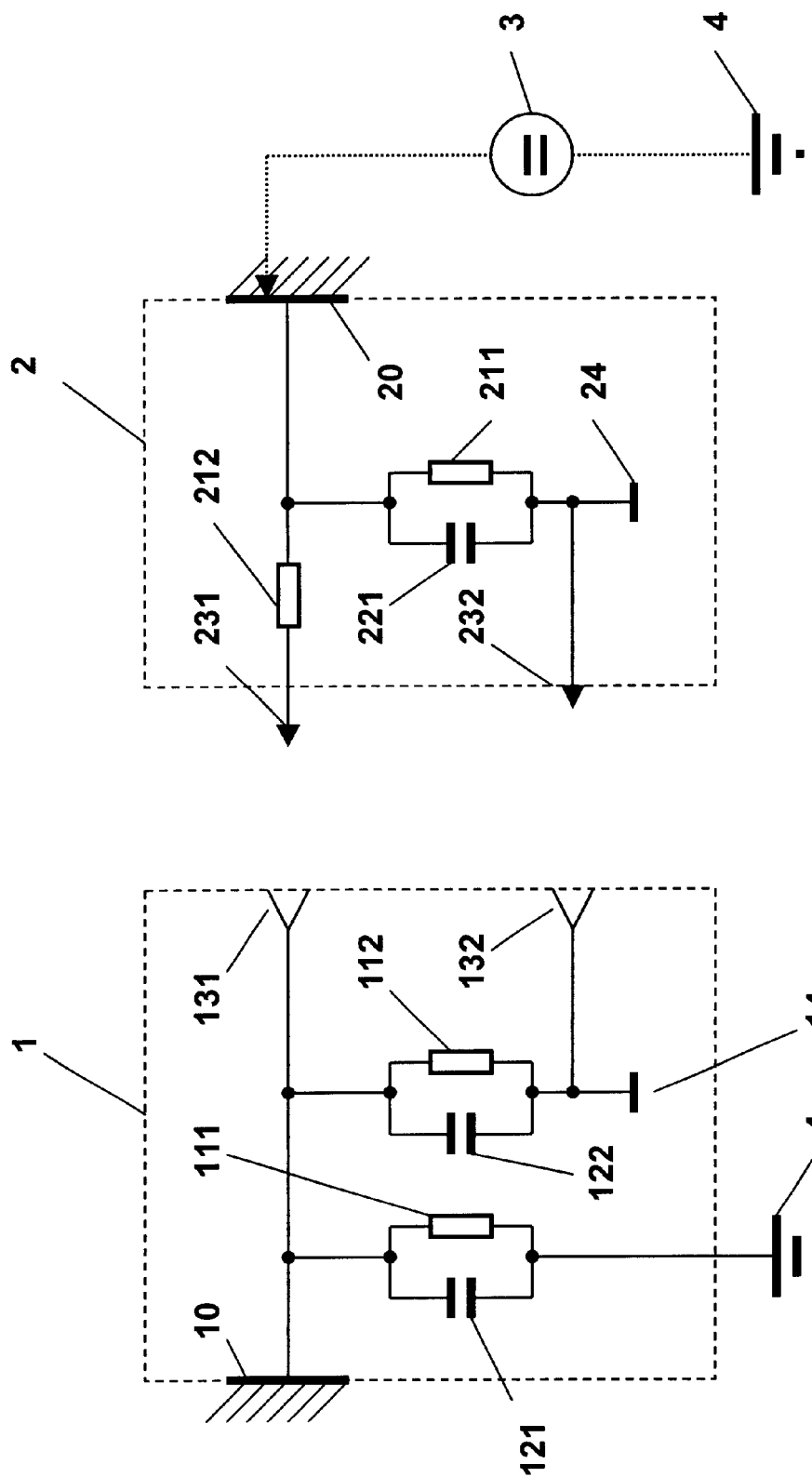

The invention relates to a system for dissipating electrostatic charges of a pluggable electrical unit when it is brought into connection with an enclosure connected to earth potential of an electrical base unit.

Complex electrical engineering systems, in particular in measuring and control technology and in telecommunications, are often of a modular construction. This involves a large number of electrical units being accommodated in an enclosure of an electrical base unit in a pluggable manner. In accordance with the relevant regulations, the enclosure is appropriately earthed.

When a complex system of this type is expanded by adding further pluggable electrical units while operation is in progress or when one of the pluggable electrical units is exchanged, there is the risk of electrical components of the pluggable electrical unit being damaged or destroyed as a result of potential-equalizing currents induced on the electrical unit to be inserted by electrostatic charges.

It is known from DE 40 36 081 to provide the plug-in connection between the pluggable electrical unit and the electrical base unit with a leading contact, by means of which the circuit frame is led. Metallic components of the pluggable electrical unit which carry electrostatic charges are optionally electrically connected to the leading contact through a resistor, or a capacitor, or a series connection comprising a resistor and a capacitor, or back-to-back Zener diodes or a series connection comprising a resistor and back-to-back Zener diodes. In this case, the direct inclusion of the current path of the circuit frame into the discharge circuit of the electrostatic charge is regarded as disadvantageous.

In DE 297 10 574 a subrack for pluggable printed-board assemblies is provided. A circuit board of the pluggable printed-board assembly has in the edge region a strip-shaped sliding contact. The subrack is provided with earthed contact elements for establishing the electrical contact of the strip-shaped sliding contact. The front plate of the pluggable printed-board assembly is connected to the strip-shaped sliding contact through a resistor. A plurality of earthed contact elements are intended to mitigate the "antenna effect" of the strip-shaped sliding contact.

The present invention is based on the object of dissipating electrostatic charges on a pluggable electrical unit in such a way that disruptions to units already in operation and damage to the unit to be inserted are avoided.

According to the invention, this object is achieved by the means of Patent claim 1. Advantageous configurations of the invention are given in the dependent claims.

The essence of the invention is to lead the frame potential and the housing potential of the base unit and of the pluggable electrical unit separately and in an earth-free manner in each case and to connect them to each other and to earth potential through attenuators.

To be specific, the base unit is provided with a first and a second attenuator. The at least partially conductive enclosure of the base unit is connected to earth potential through the first attenuator. The enclosure is connected to the frame potential of the base unit through the second attenuator. The enclosure is connected to a first contact device and the frame potential of the base unit is connected to a second contact device.

The pluggable electrical unit has a third and a fourth attenuator. The housing of the pluggable electrical unit is connected to the frame potential of the pluggable electrical unit through the third attenuator and is connected to a first mating contact device through the fourth attenuator. The frame potential of the pluggable electrical unit is connected to a second mating contact device.

The first contact device of the base unit can be connected to the first mating contact device of the pluggable electrical unit and the second contact device of the base unit can be connected to the second mating contact device of the pluggable electrical unit. In this case, the first contact device and the first mating contact device are designed as a pair of leading contacts.

To describe the mode of operation, a potential difference induced by electrostatic charging between the earth potential and the housing of the pluggable electrical unit is assumed. When the pluggable electrical unit is inserted into the base unit, initially the first contact device and the first mating contact device of the pair of leading contacts are brought into connection. As a consequence of this, a flow path is formed through the fourth attenuator for attenuated potential equalization between the enclosure of the base unit and the housing of the pluggable electrical unit. In addition, the electrostatic charge on the housing of the pluggable electrical unit is dissipated to earth potential through the series connection of the fourth attenuator and first attenuator.

This advantageously realizes both the potential equalization between the enclosure of the base unit and the housing of the pluggable electrical unit and also the dissipation of the electrostatic charge on the housing of the pluggable electrical unit to earth potential without any surges and avoiding current peaks. In addition, the circuit frame and also the supply and data lines of the base unit and of the pluggable electrical unit remain unaffected by the discharge current. Consequently, any impairment or destruction of units already in operation is avoided.

As the inserting operation proceeds, the second contact device of the base unit is brought into contact with the second mating contact device of the pluggable electrical unit. In this case, the circuit frame of the pluggable electrical unit is connected to the circuit frame of the base unit. In this case, the series connection comprising the second and third attenuators is connected in parallel with the fourth attenuator, with the result that the discharge impedance of the housing of the pluggable electrical unit to earth potential in the inserted state is additionally reduced.

According to one configurational feature of the invention, it is provided that the first attenuator of the base unit comprises the parallel connection of a capacitor and a resistor. In this way, dynamic potential differences between the enclosure of the base unit and earth potential are advantageously reduced via the capacitor with low impedance. Static potential differences are balanced out via the resistor.

According to a further feature of the invention, the second attenuator of the base unit comprises the parallel connection of a capacitor and a resistor. In this way, dynamic potential differences between the enclosure and the frame potential of the base unit are advantageously reduced via the capacitor with low impedance. Static potential differences are balanced out via the resistor.

According to a further feature of the invention, the third attenuator of the pluggable electrical unit comprises the parallel connection of a capacitor and a resistor. In this way, dynamic potential differences between the housing and the frame potential of the pluggable electrical unit are advantageously reduced via the capacitor with low impedance. Static potential differences are balanced out via the resistor.

According to a further feature of the invention, the fourth attenuator of the pluggable electrical unit comprises a resistor. In this way, all the potential differences during the insertion are advantageously dissipated from the housing with a defined impedance.

According to a further feature of the invention, the pair of leading contacts is configured as a sliding contact device with a sliding contact and a slideway. In this case, the sliding contact is formed onto the conductive enclosure of the base unit. The slideway is arranged in the edge region of the pluggable unit in the plugging direction and is dimensioned in its length such that the pair of leading contacts is closed during the insertion and open in the fully plugged state of the pluggable unit.

In this way, during the insertion phase, the intended potential equalization between the enclosure of the base unit and the housing of the pluggable unit is temporarily brought about via the pair of leading contacts and the fourth attenuator and, in the inserted state, is permanently maintained via the connected contacts for the frame potential and the second and third attenuators. In the inserted state of the pluggable unit, coupled-in electromagnetic interference received via the slideway is discharged to frame potential via the third and fourth attenuators. The coupled-in interference is in this case attenuated to such a degree that functional disruptions to units in operation are avoided.

The invention is explained in more detail below on the basis of an exemplary embodiment. In the drawings required for this purpose:

FIG. 1 shows a circuit diagram of the elements for dissipating electrostatic charges FIG. 2 shows a design detail of the pair of leading contacts a) during the plugging operation b) in the fully plugged state Represented in FIG. 1 are a base unit 1 and a pluggable electrical unit 2. The base unit 1 is configured as a subrack for receiving a plurality of functional units in the form of pluggable electrical units 2 and has an at least partially electrically conductive enclosure 10. This enclosure 10 is connected to earth potential 4 via a first attenuator, comprising a parallel connection of a capacitor 121 and a resistor 111.

In addition, the enclosure 10 is connected to a frame potential 14 of the base unit 1, which is the circuit frame of electrical functional units not represented, via a second attenuator, comprising a parallel connection of a capacitor 122 and a resistor 112. The enclosure 10 is connected to a first contact device 131 and the frame potential 14 of the base unit 1 is connected to a second contact device 132.

The pluggable electrical unit 2 has an at least partially electrically conductive housing 20. The housing 20 of the pluggable electrical unit 2 is connected to the frame potential 24 of the pluggable electrical unit 2 via a third attenuator, comprising a parallel connection of a capacitor 221 and a resistor 211. In addition, the housing 20 of the pluggable electrical unit 2 is connected to a first mating contact device 231 via a fourth attenuator, comprising a resistor 212. The frame potential 24 of the pluggable electrical unit 2 is connected to a second mating contact device 232.

The first contact device 131 of the base unit 1 can be connected to the first mating contact device 231 of the pluggable electrical unit 2 and the second contact device 132 of the base unit 1 can be connected to the second mating contact device 232 of the pluggable electrical unit 2. In this case, the first contact device 131 and the first mating contact device 231 are designed as a pair of leading contacts.

A pluggable electrical unit 2 to be inserted into the base unit 1 may be affected by an electrostatic charge. This charge is a potential difference between the earth potential 4 and the housing 20 of the pluggable electrical unit 2 and is symbolized in FIG. 1 by a voltage source 3 between the housing 20 of the pluggable electrical unit 2 and earth potential 4.

When the pluggable electrical unit 2 is inserted into the base unit 1, initially the first contact device 131 and the first mating contact device 231 of the pair of leading contacts are brought into connection. As a consequence of this, a flow path is formed via the resistor 212 for attenuated potential equalization between the enclosure 10 of the base unit 1 and the housing 20 of the pluggable electrical unit 2. In addition, the electrostatic charge on the housing 20 of the pluggable electrical unit 2 is dissipated to earth potential 4 via the series connection of the resistor 212 and the first attenuator, comprising the capacitor 121 and the resistor 111.

This realizes both the potential equalization between the enclosure 10 of the base unit 1 and the housing 20 of the pluggable electrical unit 2 and also the dissipation of the electrostatic charge on the housing 20 of the pluggable electrical unit 2 to earth potential 4 without any surges and avoiding current peaks. In addition, the circuit frame 14 and 24 and also the supply and data lines of the base unit 1 and of the pluggable electrical unit 2 remain unaffected by the discharge current. Consequently, any impairment or destruction of units already in operation is avoided.

In this phase of the insertion, the electrostatic charge on the housing 20 of the pluggable electrical unit 2 is dissipated to earth potential 4 to the extent that the circuit frame 14 of the base unit 1 and the circuit frame 24 and the housing 20 of the pluggable electrical unit 2 are at the same potential.

As the inserting operation proceeds, the second contact device 132 of the base unit 1 is brought into contact with the second mating contact device 232 of the pluggable electrical unit 2. Only now is the circuit frame 24 of the pluggable electrical unit 2 connected to the circuit frame 14 of the base unit 1. In this case, the series connection of the second attenuator, comprising the capacitor 122 and the resistor 112, and the third attenuator, comprising the capacitor 221 and the resistor 211, is connected in parallel with the resistor 212, with the result that the discharge impedance of the housing 20 of the pluggable electrical unit 2 to earth potential 4 in the inserted state is additionally reduced.

Figure 2A:
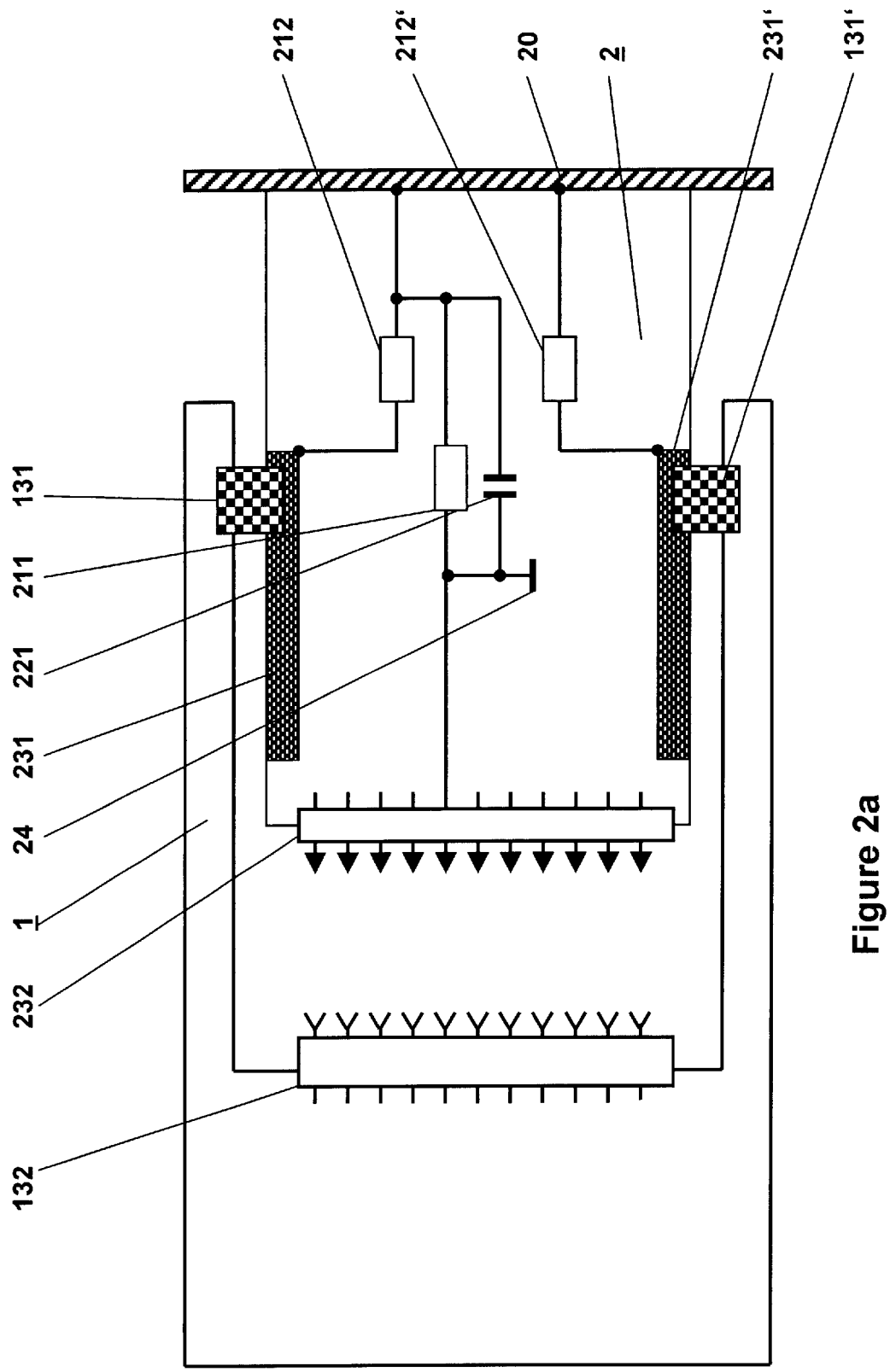
Figure 2B:
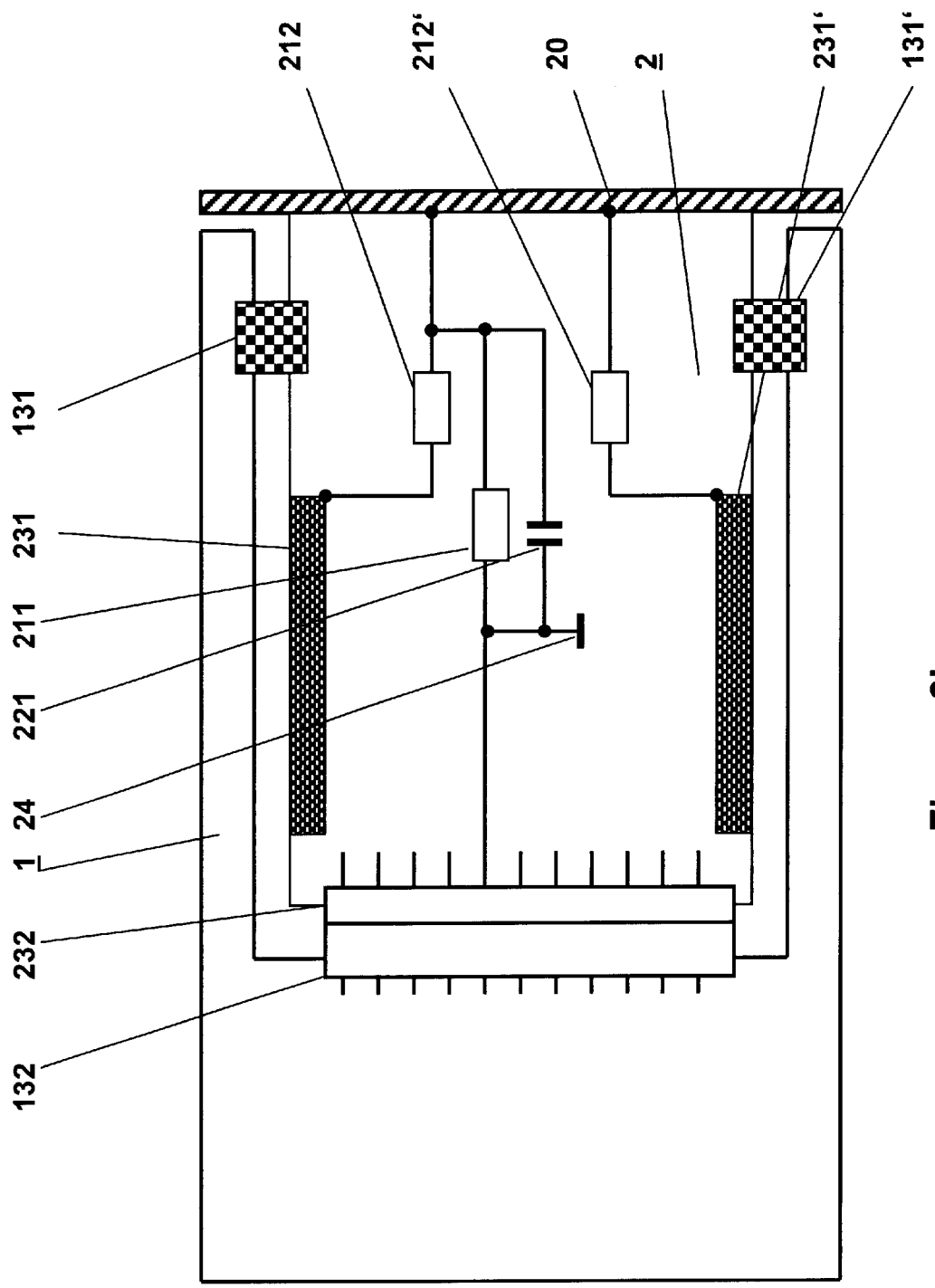

In a special configuration of the invention, the pair of leading contacts 131/231 according to FIGS. 2a and 2b are configured as a conductor track 231 and a sliding contact 131 integrated in the enclosure of the base unit 1. FIG. 2a shows here the position of the contact means 131/231 in relation to one another during the plugging operation and FIG. 2b shows the position of the contact means 131/231 in relation to one another in the fully plugged state of the pluggable unit 2, using the same reference numerals for the same means. In both figures, for the sake of overall clarity, only the means essential for an explanation of the invention are represented.

Represented in FIG. 2a is a base unit 1, which has a contact device 132 and a sliding contact 131. The base unit 1 is designed for receiving at least one pluggable electrical unit 2 and has for this purpose means not represented for securing, guiding and arresting the pluggable electrical unit 2. The base unit 1 has a compartment-shaped recess for receiving the pluggable electrical unit 2.

The sliding contact 131 is arranged close to the opening of the compartment-shaped recess and is formed onto the conductive enclosure of the base unit 1. Accordingly, in the same way as in the representation in FIG. 1, the sliding contact 131 carries the same potential as the enclosure 10 of the base unit 1. The sliding contact 131 is advantageously designed as a guiding element for the pluggable electrical unit 2.

The pluggable electrical unit 2 has a mating contact device 232, corresponding in its dimensions and arrangement to the contact device 132 of the base unit 1, and a slideway 231. Extending in the plugging direction, the slideway 231 is arranged in the edge region of the pluggable unit and in the catching region of the sliding contact 131 of the base unit 1. The length of the slideway 231 is dimensioned such that the pair of leading contacts formed by the sliding contact 131 and the slideway 231 is closed during insertion and open in the fully plugged state of the pluggable unit 2.

The slideway 231 is connected via the resistor 212 to a front plate 20, representing the housing of the pluggable electrical unit 2. The front plate 20 is connected to the frame potential 24 of the pluggable electrical unit 2 via the resistor 211 and the capacitor 221 of the third attenuator.

When the pluggable electrical unit 2 is inserted, the contact device 132 of the base unit 1 is disconnected from the mating contact device 232 of the pluggable electrical unit 2 in the way represented in FIG. 2a. The sliding contact 131 of the base unit 1 is in contact with the slideway 231 of the pluggable electrical unit 2.

In this way, during the insertion phase, the intended potential equalization between the enclosure 10 of the base unit 1 and the housing 20 of the pluggable unit 2 is temporarily brought about in a controlled manner via the pair of leading contacts, formed by the sliding contact 131 and the slideway 231, and the resistor 212 of the fourth attenuator.

In the fully inserted state of the pluggable electrical unit 2, the contact device 132 of the base unit 1 is connected to the mating contact device 232 of the pluggable electrical unit 2 in the way shown in FIG. 2b. Consequently, the frame potential 24 of the pluggable electrical unit 2 is equal to the frame potential 14 of the base unit 1. The sliding contact 131 of the base unit 1 is disconnected from the slideway 231 of the pluggable electrical unit 2. The slideway 231 is connected to the frame potential 24 of the pluggable electrical unit 2, and consequently to the frame potential 14 of the base unit 1, via the resistor 212 of the fourth attenuator and the resistor 211 and the capacitor 221 of the third attenuator.

The intended potential equalization between the enclosure 10 of the base unit 1 and the housing 20 of the pluggable unit 2 is permanently maintained in the inserted state via this flow path.

It may additionally be envisaged to screw the pluggable electrical unit 2 to the base unit 1. In this case, the front plate 20, representing the housing of the pluggable electrical unit 2, is connected over a large surface area to the enclosure 10 of the base unit 1. The intended potential equalization between the enclosure 10 of the base unit 1 and the housing 20 of the pluggable unit 2 is maintained permanently and at low resistance in the inserted state via this flow path. In addition, the pluggable electrical unit 2 is secured against being unintentionally pulled out of the base unit 1 and against unintentional loosening of the second mating contact device 232 of the pluggable electrical unit 2 in the second contact device 132 of the base unit 1.

In a special configuration of the invention, the pluggable electrical unit 2 has on each opposite side a slideway 231 and 231'. The enclosure 10 of the base unit 1 has on each opposite side, and in a way corresponding to the sideways 231 and 231', a sliding contact 131 and 131'.

For this purpose, it may be envisaged in a first embodiment to connect the two slideways 231 and 231' to each other via a conductor bridge and to the front plate 20 via a common resistor 212.

To avoid a conductor bridge intersecting the pluggable electrical unit 2, it may be envisaged in an alternative embodiment, as represented in FIGS. 2a and 2b, to connect each of the two slideways 231 and 231' to the front plate 20 via a separate resistor 212 and 212' in each case.

Irrespective of the type of connection of the two slideways 231 and 231' to the front plate 20, it is the case for both embodiments that the pairs of leading contacts 131/231 and 131'/231' formed by the two slideways 231 and 231' and the sliding contacts 131 and 131' are electrically connected in parallel.

If the pluggable electrical unit 2 comprises a circuit board coated with copper on both sides, it may be envisaged in a special configuration of the invention to provide on both coating sides of the circuit board congruent slideways 231 and 231' which are electrically connected to each other in pairs by means of what are known as plated-through holes.

All the embodiments with a plurality of slideways 231 and 231' advantageously share the common feature that contact interruptions that are unavoidable in principle with sliding contact connections can be overcome.

It is to be understood that the description of the preferred embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A system for dissipating electrostatic charges of a pluggable electrical unit with an at least partially electrically conductive housing when said pluggable electrical unit is brought into connection with an at least partially electrically conductive enclosure connected to earth potential of an electrical base unit using a pair of leading contacts comprising:

said base unit comprising a first attenuator, a second attenuator, a first contact device and second contact device, said enclosure connected to:
   (i) earth potential by way of said first attenuator; and
   (ii) the frame potential of the base unit by way of said second attenuator;

said enclosure connected to said first contact device and said frame potential of the base unit connected to said second contact device;

said pluggable electrical unit comprising a third attenuator, a fourth attenuator, a first mating contact device connectable to said first contact device of said base unit and a second mating contact device connectable to said second contact device of said base unit;

said housing of said pluggable electrical unit connected to:
   (i) the frame potential of the pluggable electrical unit by way of said third attenuator; and
   (ii) said first mating contact device by way of said fourth attenuator;

said second mating contact device connected to the frame potential of the pluggable electrical unit; and said pair of leading contacts being formed by the first contact device and the first mating contact device.

2. The system of claim 1 wherein said first attenuator of said base unit comprises the parallel connection of a resistor and a capacitor.

3. The system of claim 1 wherein said second attenuator of the base unit comprises the parallel connection of a resistor and a capacitor.

4. The system of claim 1 wherein said first attenuator of the pluggable electrical unit comprises the parallel connection of a resistor and a capacitor.

5. The system of claim 1 wherein said second attenuator of the pluggable electrical unit comprises a resistor.

6. The system of claim 1 wherein said pair of leading contacts comprises a sliding contact device with a contact device configured as a sliding contact and a mating contact device configured as a slideway.

7. The system of claim 6 wherein said sliding contact is formed onto the conductive enclosure of the base unit and the slideway is a conductor trace extending in the plugging direction in the edge region of the pluggable unit, the length of which is dimensioned such that the pair of leading contacts is open in the fully plugged state of the pluggable unit.

8. The system of claim 6 wherein said pluggable unit has on each opposite side a slideway and the enclosure of the base unit has on each opposite side, and in a way corresponding to the slideways, a sliding contact, the two pairs of leading contacts being electrically connected in parallel.

9. The system of claim 7 wherein said pluggable unit has on each opposite side a slideway and the enclosure of the base unit has on each opposite side, and in a way corresponding to the slideways, a sliding contact, the two pairs of leading contacts being electrically connected in parallel.

* * * * *